United States Patent
Druz et al.

(10) Patent No.: US 6,464,891 B1
(45) Date of Patent: Oct. 15, 2002

(54) METHOD FOR REPETITIVE ION BEAM PROCESSING WITH A CARBON CONTAINING ION BEAM

(75) Inventors: Boris L. Druz, Brooklyn; Kurt E. Williams, Flushing; Alan V. Hayes, Centerport, all of NY (US)

(73) Assignee: Veeco Instruments, Inc., Plainview, NY (US)

( * ) Notice: Subject to any disclaimer, the term of this patent is extended or adjusted under 35 U.S.C. 154(b) by 0 days.

(21) Appl. No.: 09/270,998

(22) Filed: Mar. 17, 1999

(51) Int. Cl.[7] .................................. B44C 1/22
(52) U.S. Cl. ..................... 216/67; 134/1; 134/1.1; 134/22.1; 216/66; 204/192.11; 204/192.34
(58) Field of Search ................. 134/1, 1.1, 22.1; 216/66, 67; 204/192.11, 192.34

(56) References Cited

U.S. PATENT DOCUMENTS

| | | | |
|---|---|---|---|
| 3,913,320 A | 10/1975 | Reader et al. | 60/202 |
| 4,142,958 A | 3/1979 | Wei et al. | 204/192 P |
| 4,490,229 A | 12/1984 | Mirtich et al. | 204/192 C |
| 4,739,214 A | 4/1988 | Barr | 313/362.1 |
| 4,778,561 A | 10/1988 | Ghanbari | 156/543 |
| 4,791,719 A | 12/1988 | Kobayashi et al. | 29/603 |
| 5,144,147 A * | 9/1992 | Shiozaki et al. | 250/492.2 |
| 5,198,718 A | 3/1993 | Davis et al. | 313/359.1 |
| 5,274,306 A | 12/1993 | Kaufman et al. | 315/111.41 |
| 5,312,519 A * | 5/1994 | Sakai et al. | 134/1 |
| 5,438,747 A | 8/1995 | Krounbi et al. | 29/603 |
| 5,508,368 A | 4/1996 | Knapp et al. | 427/534 |
| 5,554,854 A * | 9/1996 | Blake | 250/492.21 |
| 5,589,041 A * | 12/1996 | Lantsman | 204/192.33 |
| 5,925,212 A * | 7/1999 | Rice et al. | 216/58 |
| 5,948,283 A * | 9/1999 | Grosshart | 216/67 |

FOREIGN PATENT DOCUMENTS

| | | |
|---|---|---|
| JP | 61-050335 A * | 3/1986 |
| WO | 95/23652 | 9/1995 |

OTHER PUBLICATIONS

85014814, IBM Technical Disclosure Bulletin "Novel Technique to Improve Water Via Resistances" vol.27, No. 8, p. 4814, Jan. 1, 1985.*
Grill, Cold Plasma in Materials Fabrikation, IEEE Press, 1994.*
Extracts from Bernhard Wolf (ed.) *Handbook of Ion Sources*, CRC Press, Inc., Boca Raton, FL pp. 209–312 (1995).
Loeb et al, "State–of–the–Art of the Rit–On Thrusters and Their Spin Offs", preprint IAF–88–258, 39th Congress of the International Astronautical Federation, Oct. 8–15, 1988/ Bangalore, India.
Sol Aisenberg and Ronald Chabot, "Ion–Beam Deposition of Thin Films of Diamondlike Carbon", Journal of Applied Physics, vol. 42, No. 7, Jun. 1971, pp. 2953–2958.

(List continued on next page.)

*Primary Examiner*—Alexander Markoff
(74) *Attorney, Agent, or Firm*—Morgan & Finnegan, L.L.P.

(57) ABSTRACT

A method is provided for a repetitive deposition and etch of a substrate using a carbon containing ion beam in a gridded ion source. The method includes the actual ion beam processing step combined with the thermal and chemical conditioning of the ion source and a special cleaning step(s). The special cleaning step(s) effect robust removal of the precipitates accumulated in the operating source due to the decomposition of carbon containing gases such as hydrocarbons and halocarbons Precipitate removal is achieved by employing ions and radicals formed in an inert gas plasma or a mixture of inert gas and oxygen to reactively etch or bombard the precipitates.

28 Claims, 3 Drawing Sheets

OTHER PUBLICATIONS

James M.E. Harper, "Ion Beam Deposition", *Thin Film Processes*, Academic Press, Inc. 1978, pp. 175–206.

M. Hanazono, S. Narishige, and K. Kawakami, "Fabrication of a thin film head using polyimide resin and sputtered Ni–Fe films", J. Appl. Phys.,53(3), Mar. 1982, pp. 2608–2610.

Bruce A. Banks and Sharon K. Rutledge, "Ion Beam Sputter Deposited Diamondlike Films Films", NASA Technical Memorandum 82873, prepared for mtg of Grtr NY Chapter of American Vacuum Society, Yorktown Heights, NY, Jun. 2, 1982.

L. David Bolinger, "Ion Beam Etching with Reactive Gases", Solid State Technology, Jan. 1983, pp. 99–108.

M. Hanazono, S. Narishige, S. Hara, K. Mitsuoka, K. Kawakami and Y. Sugita; S. Kuwatsuk, T. Kobayashi, M. Ohura and Y. Tsuji, "Design and fabrication of thin–film heads based on a dry process", J.Appl.Phys.61(8), Apr. 15, 1987, pp. 4157–4162.

H. W. Loeb, J. Freisinger, K.H. Groh and A. Scharmann, "State–of–the–Art of the Rit–Ion Thrusters and their Spin–Offs", $39^{th}$ Congress of the International Astronautical Federation, Oct. 8–15, 1988, Bangalore, India.

Takashi Kawabe, Moriaki Fuyama, and Shinji Narishige, "Selective Ion Beam Etching of $Al_2O_3$ Films" J. Electrochem. Soc., vol. 138, No. 98, Sep. 1991, pp. 2744–2748.

T. Kawabe, M. Fuyama, S. Narishige and Y. Sugita, "Fabrication of Thin Film Inductive Heads with Top Core Separated Structure", IEEE Transaction on Magnetics, vol. 27, No. 6 Nov. 1991, pp. 4935–4938.

Lien–Chang Wang, Gary Halada, and Richard J. Gambino, "Radio frequency ion beam depostion of diamond–like carbon for sliders and heads", J.Appl.Phys. 79(8), Apr. 15, 1996 pp. 5776–5778.

* cited by examiner

METHOD FOR REPETITIVE ION BEAM PROCESSING WITH A CARBON CONTAINING ION BEAM

FIELD OF THE INVENTION

The invention relates generally to processing a surface on a substrate, e.g., depositing a coating on or etching by using a carbon containing ion bean using a gridded ion source, particularly an RF or microwave plasma source.

BACKGROUND OF THE INVENTION

Ion beam processing has many applications in microelectonics device fabrication. It is used, for example, in the production of high frequency microwave integrated circuits and thin magnetic heads.

In surface modification or ion beam etching, generally known as "ion milling", a beam of ions is extracted from a plasma ion source by electrostatic methods and is used to remove material from a substrate mounted in the path of the beam. In reactive ion milling methods, certain chemical(s) are introduced to the ion source or to the etching chamber which cause chemical reactions to occur on the substrate as part of the milling process. Often the chemical process is affected by energetic assistance by the plasma (in the ion source) and/or the ion beam.

There are two basic configurations for ion beam deposition. In "primary" or "direct" ion beam deposition, an ion beam source is used to produce a flux of particles, including constituents of the desired film, which are accumulated at the substrate. In one type of "primary" ion beam deposition, the deposited material is formed by reactive means from precursor chemicals introduced to the ion source, usually in the gas phase. An example of great practical value is the production of diamond-like carbon films by direct ion beam deposition from an ion source operated on hydrocarbon gas(es), such as methane.

Another configuration in which ion beams can be used for thin film deposition is commonly known as "secondary ion beam deposition", or "ion beam sputtering". In this method, an ion beam comprising particles which are not essential to the deposited film are directed at a target of the desired material so as to sputter it, with the sputtered target material being collected on the substrate. Secondary ion beam deposition can be a completely inert sputtering process. Alternatively, certain chemicals can be added to the ion source or elsewhere in the deposition chamber to alter the chemical properties of the deposited film either by reaction with the target material or with the substrate. This can be done with or without energetic activation by the ion source plasma or the ion beam.

DC sources have disadvantages compared with other sources for etching and thin film deposition techniques in terms of ion source maintenance and reactive gas compatibility. Ion beam sources with filament type cathodes, for example, are the easiest to operate and maintain but require frequent replacement of the filament assembly. Furthermore the hot filaments are rapidly attacked in the plasma state by gases which are useful for thin film deposition and etching, such as hydrocarbon, oxygen, hydrogen, and fluorinated gases. Ion sources equipped with hollow cathodes are difficult to maintain. Also, they generally cannot be operated with high concentrations of reactive gas because the hollow cathodes are easily contaminated and must be protected by continuous purging with inert gas. Cold cathodes can be more easily maintained and are compatible with some reactive gases but have other limitations, such as generally low ion beam density, and poor beam collimation. These shortcomings of DC sources can hinder the implementation of ion beam processes in manufacturing processes.

In contrast with DC sources, many RF sources do not require any discharge electrodes directly in contact with the plasma. However, an electrode must be provided to control the plasma potential and provide for charge compensation of the plasma. For example, in U.S. Pat. No. 5,198,718 it is performed by the "screen" grid portion of the ion optics.

In general, plasma and radical concentrations are quite sensitive to source surface conditions and temperature. Stability improvement can be achieved by special source conditioning procedures. However, the problems of aging and irreproducibility become more complicated if conditioning of the source internal surfaces and source operation is accompanied with deposition on the walls and electrodes of high electrical resistivity precipitates. Changes in the conductivity of the electrode surfaces can cause charge build-up in the ion source by inhibiting electrical current flow between the plasma and the electrode which is used to control the plasma potential. Charge build-up inevitably results in arcing (electrical breakdowns) and flaking-off of the precipitates. This phenomenon leads to process irreproducibility, significant reduction of operation time, issues of electrostatic discharge (ESD) damage to the substrate under process, and increase of macroparticulate contamination. These limitations greatly hinder the implementation of methods using hydrocarbon or halocarbon precursor gases in practical applications.

SUMMARY OF THE INVENTION

It is an object of the present invention to provide a highly repeatable, long duration repetitive processing (etch or deposition) of a surface on a substrate using a gridded ion source, especially an RF or microwave plasma source, for operation with reactive gases containing carbon, such as hydrocarbons or halocarbons, that form high electrical resistivity precipitates inside of the source.

Another object of the present invention to achieve low macroparticulate ion beam processing.

Another object of the present invention to minimize ESD effects during ion beam processing.

The foregoing objects can be achieved according to the present invention by using a multistep procedure that includes the actual ion beam processing step combined with the thermal and chemical conditioning of the ion source, and special cleaning steps. This procedure is very effective in accomplishing repeatable processing conditions for the actual ion beam processing step for a significant number of runs, e.g., generally greater than about 50 runs and more particularly greater than about 1000 runs.

Moreover, this invention minimizes accumulation of precipitates in the source and reduces macroparticle agglomeration and delamination (flaking), providing a low level of macroparticle generation in the system during ion beam processing. The method is especially beneficial for sustaining stable ion beam operation in the actual ion beam processing steps and in minimizing electrostatic discharge.

In accordance with the invention, the subject method comprises, prior to deposition or etch, the steps of providing an inert gas plasma in the source to establish steady-state thermal conditions in the source, carbon containing plasma conditioning of the source, and ion beam stabilization. A cleaning procedure is performed by removal of the precipitates from the source and the ion beam optics, or areas of the source and the ion beam optics which are responsible for provision of an electrical conduction path during ion beam extraction. The removal of precipitates is achieved by an inert ion assisted reactive oxygen etching process, or by inert ion beam sputtering.

Other features and advantages of the present invention will be further described and more readily apparent from a review of the detailed description and preferred embodiments, which follow.

DETAILED DESCRIPTION OF THE INVENTION

Figure 1:
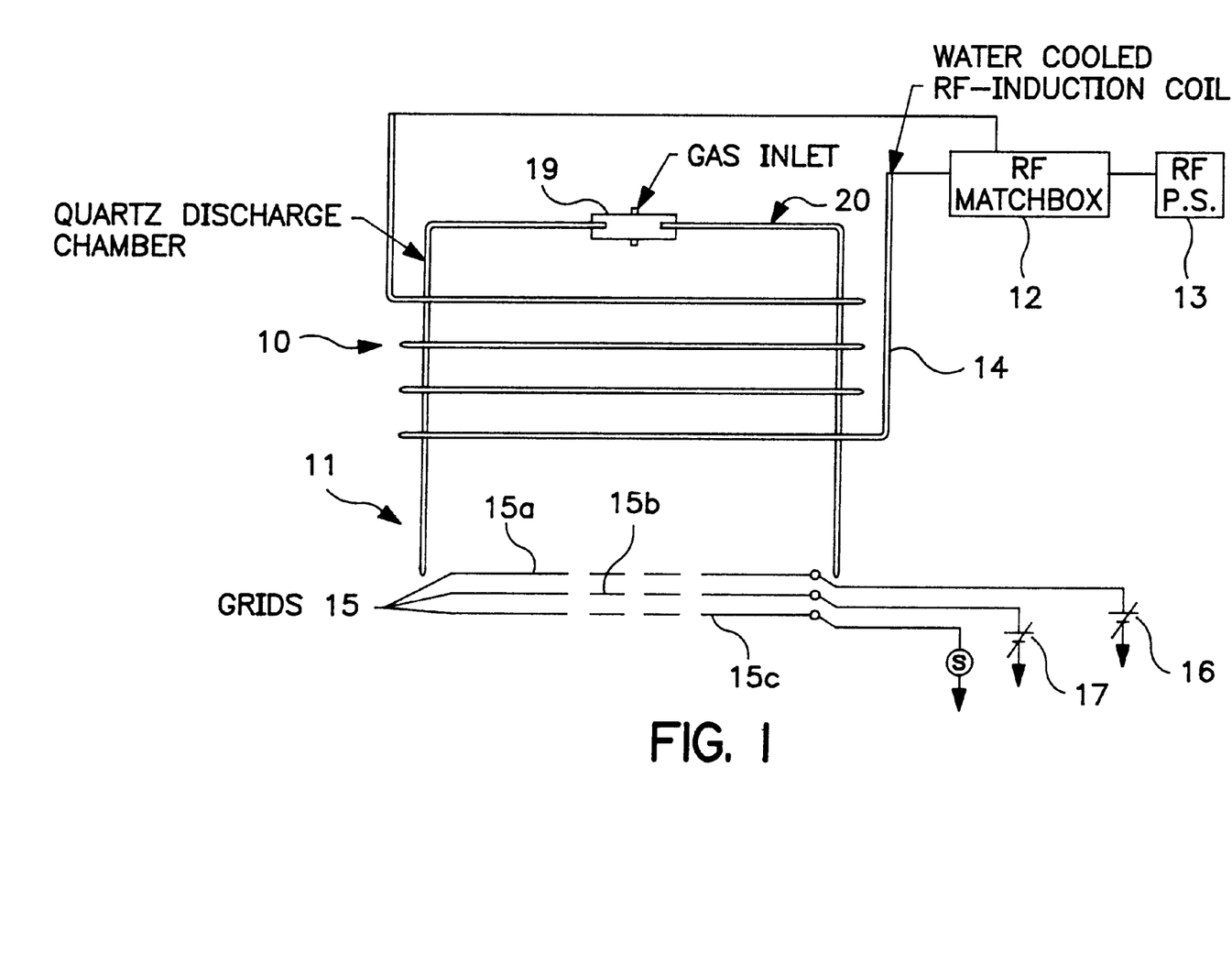
FIG. 1 is a schematic view of an inductively coupled RF charged particle source with a helical RF coil and three-grid ion beam optics. This figure illustrates an embodiment of the present invention in which the removal of the precipitates is achieved by inert ion assisted reactive oxygen etching process.

FIG. 1 is a schematic diagram illustrating an inductively coupled RF ion beam source known in the prior art. Other types of ion sources, including RF capacitively coupled or helicon wave coupled sources, as well as RF inductively coupled source with internal RF coils and electron cyclotron resonance sources, and others are known to persons skilled in the art and need not be described in detail.

As shown in FIG. 1, an inductively coupled RF ion beam source 10 typically includes a plasma discharge vessel 11 having walls 22 which may be made of quartz. The source 10 further includes an RF matchbox 12, an RF power supply 13 connectable to the matchbox and an RF applicator or energy generator 14 which is depicted in FIG. 1 as a water cooled RF induction coil. Coil 14 is connected to matchbox 12, and as illustrated, vessel 11 is disposed within coil 14. Working gas is provided inside of the source through an inlet 19.

The source 10 further includes a multihole grid electrode assembly 15 which substantially contains the plasma within discharge vessel 11 and controls the extraction of ions from the vessel. As shown, there may be three grids. The first grid, known as a "screen" grid 15a, is disposed in contact with the plasma. Grid 15a is connectable to a positive high voltage ion beam power supply 16. Thus, grid electrode 15a is the electrode which controls the potential of the plasma. The plasma potential control electrode is referred to as the "anode." In general, a separate electrode can be used for the plasma potential control, and the grid can be on the floating potential, or connected to the separate electrode through a resistor preventing the grid 15a from functioning as an anode. The second grid 15b, commonly termed the "accelerator", is connectable to a negative high voltage supply 17. The third grid 15c, known as the "decelerator" is at electrical ground potential. All of the grids include a plurality of apertures configured in known fashion to optimize confinement of the plasma within plasma vessel 11 while allowing and, in part, directing the extraction of ions from the plasma.

As mentioned above, the performance of reactive ion beam processing depends on plasma and radical concentrations in the system, which are quite sensitive to source surface conditions. The chemical nature and temperature of the source surface define the composition of species in the source. Variation of the surface chemistry and temperature inevitably leads to loss of the ion beam processing control and reproducibility.

Another issue related to the source operation is the sustaining of quasi-neutrality of the ionized plasma. For every ion removed, an electron should also be removed. These electrons are collected on the first grid (15a) in this example and flow through the beam power supply, causing an indicated "beam current" reading.

To illustrate the generation of high electrical resistivity precipitates inside of the source, consider operation of a helical inductively coupled source, (e.g. the Microetch RIM-210 made by Veeco Instruments, Inc., the assignee hereof) on methane. Performance runs of two hours or more were conducted with the beam voltage in the range of about 100–900 V, the accelerator voltage was about 400 V, and the gas flow was about 20 sccm. Three distinct periods of system behavior during the runs were observed. The first period, about 30 to 40 min., was characterized by stable operation; the second period, about 40 to 90 min., by a growing amount of instability in the ion beam current of up to about 10% of average magnitude; the third period of about 90 to 100 min., by extinction of the plasma. During this latter period the plasma could be reignited and maintained for a short time, about 40 sec. After this period, however, the plasma could not be restored. While the exact time of these periods varied depending on operating parameters, the trends remained the same. In addition, at low beam voltage, (less than about 300V) an increase of the accelerator grid current from about 20 to about 30 mA was observed.

Direct observation of the source walls and grids after the above runs demonstrated deposition of high resistivity precipitates all over the source internal surfaces. These findings are related to the source operational problems as follows:

Coating of the conductive electrode which is used to control the plasma potential by high electrical resistivity precipitates causes drastic changes in plasma conditions. Precipitates on the electrode appear as a resistive layer that is introduced between the electrode and the plasma. Obviously, there is a voltage drop across this layer. As the layer thickens, its resistivity increases until the voltage drop exceeds the electrical breakdown limit. Arcing in the source caused by electrical breakdown causes unstable source operation and eventually the plasma is extinguished.

Another effect which can be observed after long term operation of some ion sources with particular working gases is the deposition of a resistive layer on the accelerator grid, and the ground grid, particularly along the circumference of each aperture. This is presumably due to the incidence on the grid of ions streaming from the plasma, perhaps from the tails of the extracted beamlets. This can lead to electrical surface charging and modification of the inter-grid electrical field configuration. As a result, deterioration of the beam collimation, backstreaming of oppositely charged particles from the chamber into the source and a resulting occurrence of a false beam current reading, and an increased accelerator grid current can occur.

In accordance with the invention, source thermal stabilization is performed by providing an inert gas plasma in the source for a time sufficient to reach steady state thermal conditions in the source. Typically, the stabilization time is in the range of about 15 seconds to about 15 minutes, depending on the temperature at the beginning of the processing step.

The subject method also preferably includes the step of chemical conditioning of the source. This may be done by providing a carbon, e.g. a hydrocarbon or halocarbon, containing plasma in a source for a time sufficient to establish steady state plasma conditions in the source, including the coating of the source walls with at least a mono-layer of involatile reaction product. Ion beam stabilization is preferably achieved by having a carbon, e.g. a hydrocarbon or halocarbon, containing plasma in the source and the ion beam under the substantially same energy input and a precursor gas or gases flow at conditions close to those of the step of etch or deposition on the substrate. The chemical conditioning and ion beam stabilization times may be in the ranges of about 15 seconds to about 4 minutes, and about 2 seconds to about 1 minute, respectively.

Another aspect of the invention includes a step of processing (deposition or etch) of the surface of a substrate with a carbon, e.g. a hydrocarbon or halocarbon, containing ion beam. As a result of the prior steps, stable conditions of the ion beam source are accomplished, i.e. source internal temperature, surface chemical conditions, ion and electron temperature distribution, beam collimation, etc. This, in turn, results in achievement of stable parameters of etch or deposition (e.g., rate and uniformity) during the step of ion beam processing of the substrate.

The subject invention also includes a cleaning procedure which is performed by a removal of the precipitates from the source and the ion beam optics, particularly areas which provide electrical conduction to prevent charge build-up in the source and ion beam optics, during ion beam extraction. The removal of the precipitates may be achieved by an inert ion assisted reactive oxygen etching process, or by inert ion beam sputtering.

As discussed above, accumulation of precipitates in the source eventually leads to alteration of the resistivity in the electron extraction circuit, accelerator and decelerator grid electrical circuits, and this can result in source operation failure. The method of the subject invention minimizes accumulation of precipitates in the source.

In developing a precipitates cleaning process in accordance with the subject invention, several things were discovered. First, in using pure oxygen plasma, the precipitates were removed in a nonuniform fashion, leading to its delamination and the formation of flakes and macroparticles. On the other hand, a plasma formed from a mixture of precursor gases including inert gas and oxygen, particularly a mixture having a ratio of mass flow rates of inert gas to oxygen in a range of approximately from about 1:4 (about 20% inert gas to about 80% oxygen) to about 2:1 (about 66.7% inert gas to about 33.3% oxygen) was found to provide effective layer by layer removal of the precipitates, completely preventing the aforesaid formation of flakes and particles. Second, overcleaning, i.e., further treatment beyond complete removal of the precipitate coating, modified metallic surfaces in the source to create enhanced electron emissivity. That, in turn, led to the development of uncontrollable discharge in the source. Third, the subject precipitates typically contain hydrogen and/or fluorine, water, carbon monoxide, carbon dioxide, etc. Also the etch product is absorbed by the source surfaces, and further is gradually released into the source and the chamber. It was found that inert ion bombardment significantly reduces the amount of hydrogen or fluorine contained in the precipitate. This, in turn, leads to a reduction of water and fluorine based compounds that formed during oxygen plasma cleaning and, therefore, contributes to removal of the etch product from the source surfaces after the oxygen containing plasma etch is completed. The residual impurities reduction is especially important for impurity sensitive processes, e.g., diamond like carbon deposition.

In summary, most effective cleaning of the inside of the source is performed by generating both an inert gas/oxygen plasma and a substantially pure inert gas plasma in the source. Two ways can be used to clean the grids. The first way is to remove the precipitates by an ion assisted reactive etching process employing an inert gas-oxygen mixture. This is preferably done using a low ion energy, e.g. less than about 100 V. The second way is to sputter the precipitates on the grids by an inert gas ion bombardment. Preferably, inert gas ion bombardment is used before and reactive gas cleaning with ions and radicals from an inert gas oxygen mixture plasma. To deliver ions to the grids, positive voltage was applied to the first grid member, and a negative voltage was applied to the second grid.

As discussed above, a separate electrode can be used for the plasma potential control, and the first grid 15a can be allowed to be at floating potential or connected to the separate electrode through a resistor which prevents grid 15a from functioning as an anode. This modification, however, is not critical for carrying out of the first embodiment of the present invention.

Figure 2:
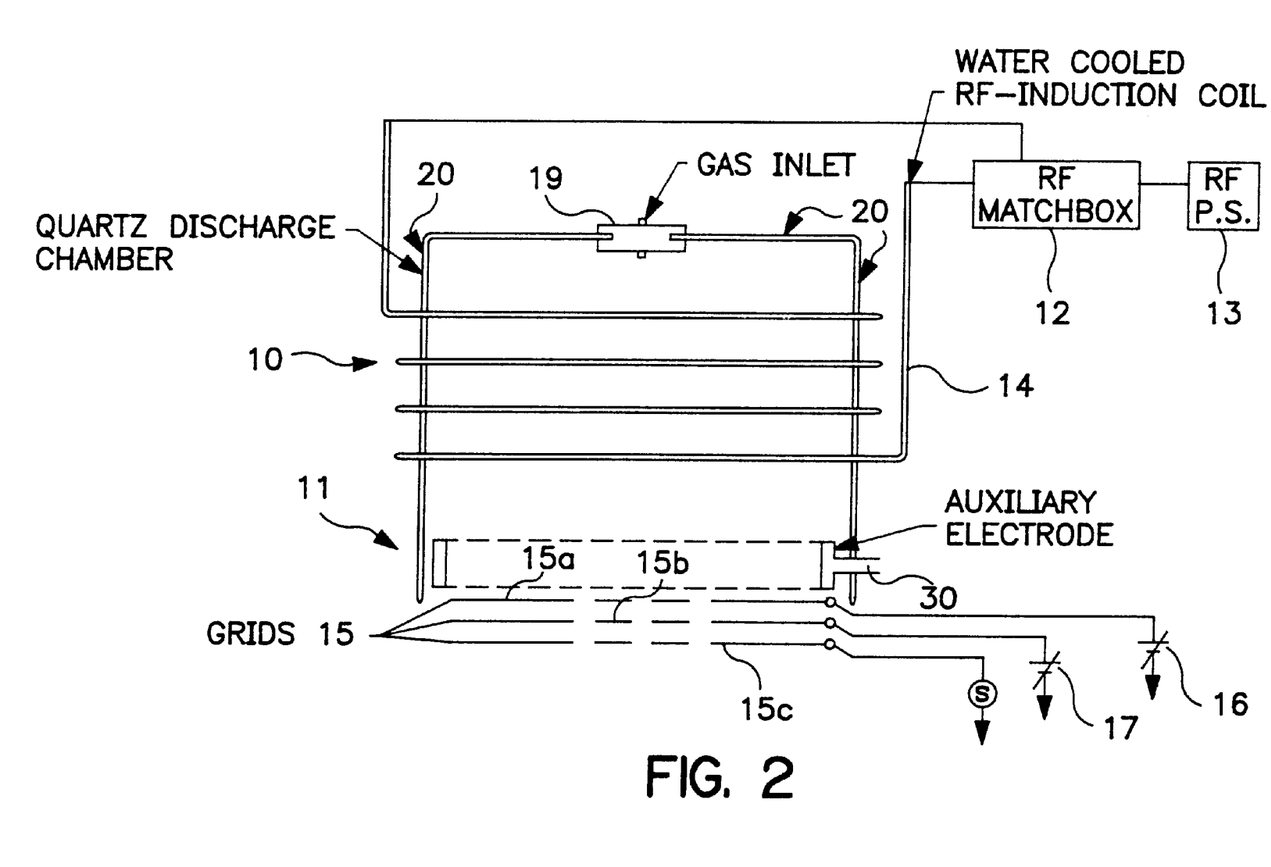
FIG. 2 is a schematic diagram of an inductively coupled RF charged particle source with a helical RF coil, an auxiliary electrode member inside of the source which is connectable to an AC voltage power supply, and three-grid ion beam optics. This figure illustrates another embodiment of the invention in which the removal of the precipitates is achieved by an inert ion beam sputtering process.

The ion beam source for carrying out another embodiment of the present invention is shown in FIG. 2. In addition to the ion source schematics presented in FIG. 1, the schematics in FIG. 2 contains an auxiliary electrode member 30 inside of the source which is connectable to an AC voltage power supply. This embodiment of the invention is similar to the embodiment described above except that the removal of the precipitates is achieved by only an inert ion beam sputtering process. Accordingly, for the sake of simplicity and to avoid repetition only the source cleaning procedure will be described in detail.

Important portions of the ion source to be cleaned are the first grid—the screen grid, and the second grid—the accelerator grid. The removal of the precipitates from the auxiliary electrode and the first grid surfaces was successfully achieved by ion sputtering by applying an AC voltage on the auxiliary electrode, and ground potential on the grids while having plasma in the source. The second grid was cleaned by forwarding a portion of the inert ion beam extracted from the corresponding plasma.

To perform effective precipitate cleaning, and at the same time to sustain stable source operation, the cleaning procedure was performed by gradual increases of the source parameters, such as AC voltage amplitude on the auxiliary electrode, positive voltage value on the first grid member, negative voltage value on the second grid member, the discharge power, and the gas flow values.

As the magnitude of each of these cleaning parameters is raised, the rate of sputter etching of the precipitates is increased. At the same time, however, the current drawn through the electrodes increases. Initially, when the electrode surfaces are heavily coated with precipitates, their electrical conductivity is low. At this stage any attempt to operate the ion source at parameters which require high current flow through the electrodes will result in charge accumulation on the electrode and unstable operation of the ion source. Therefore, the magnitude of the cleaning parameters initially should be set to values that are considerably lower than the example values described herein, but then can be gradually increased to those levels without causing instability, but to provide effective cleaning.

For example, a procedure to adjust the parameter settings to achieve this aim may be used as follows: prepare a process with several steps. In the first step, each of the values of the cleaning parameters will be much lower than the example values given herein. In the second step each of the values of the cleaning parameters will be set between those of the first step and the example values, but may be closer to those of the first step. In the third, fourth, etc. steps, the values may gradually increase, until in the final step, the example values of the cleaning parameters are obtained. Assign a process time for each step, for example 90 seconds for all steps except for the last step, which might be longer, for example, 5 minutes. Test the process under suitable conditions and observe indicators of ion source stability, such as the grid voltages. If instability is noted during a particular step, stop the process, return to the previous step, run the process at this step for a longer period of time, then continue on to the next step. If instability occurs during the first step, create a new recipe with values of the cleaning parameters lower than those of the first step, and run this recipe as a new first step. After running through and modifying the process as required, save the modified process procedure. At the next suitable test time, retest the modified process in the same way. If further modifications are required, continue testing until a reliable stable cleaning process is found.

For further enhancement of reliability and process flexibility, the test process described above can be incorporated in an automatic process. A controller provided with indicators of ion source stability, such as the grid voltages, can be provided with an algorithm to determine if the source is unstable and can then adjust the cleaning process procedure according to the given rules. This can be done periodically, as desired (with all changes being saved until the next auto test) or 100% of the time as an "auto-cleaning" procedure that is part of the, normal operation of the system.

In addition, because the source is operating with an accumulation of precipitates on the nonconductive parts, stable thermal conditions should be maintained during operation to minimize delamination of the precipitate coating due to a mismatch in the coefficients of thermal expansion of the precipitates and materials that the precipitates were formed on.

Figure 3:
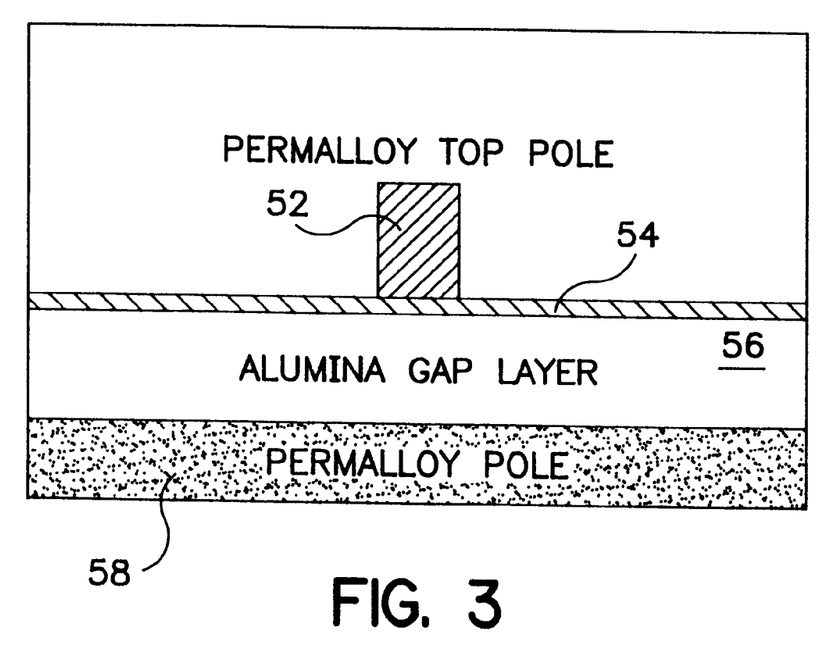
FIG. 3 is a schematic vertical cross-section through a pole region of a structure to undergo a partial pole trimming process, in accordance with an embodiment of the present invention.

FIG. 3 illustrates a vertical cross-section through the pole portion of a multilayer structure being processed to form a magnetic head device. A lower permalloy (i.e., Ni:Fe) pole layer 58 underlies an alumina (i.e., Al2O3) gap layer 56 which underlies a permalloy seed layer 54. A patterned upper pole layer 52 defined at a desired track width overlies selective portions of permalloy seed layer 54. In this embodiment, the patterned upper pole is formed by patterned, selective electroplating (e.g., photoresist frame plating) onto seed layer. Alternatively, for example, patterned upper pole layer may be formed by blanket vacuum deposition (e.g., sputtering) of permalloy directly onto alumina gap layer, followed by ion beam etch (IBE) or reactive ion beam etch (RIBE) using a patterned photoresist layer as a mask to define the upper pole, followed by photoresist removal (e.g., wet chemical dissolution, plasma ashing, or RIBE). Yet another alternative for defining the upper pole layer is by liftoff of vacuum deposited permalloy. Illustrative nominal thickness for the lower permalloy pole layer, alumina gap layer, permalloy seed layer, and patterned upper pole layer are 3 $\mu$m, 0.25 $\mu$m, 0.05 $\mu$m, and 3 $\mu$m, respectively. A goal of the pole trimming process is to etch anisotropically through gap material while minimizing the amount of patterned upper pole layer material removed.

From the foregoing description, it is clear that the present invention provides an improved method for a repetitive ion beam processing using carbon containing gases such as halocarbon and hydrocarbon gases. Important technical advantages of the present invention include high reproducibility, long duration operation (e.g. more than 1000 runs), particulate reduction, and process stability that prevents ESD.

The examples which follow illustrate the superior performance of the method of this invention. The examples are for illustrative purposes only and are not meant to limit the scope of the claims in any way.

Ion beam processing in the following examples was performed using ion beam systems made by Veeco Instruments, Inc., the assignee of this invention. The Veeco ion beam system comprises a vacuum chamber with an RF ion beam source (fundamentally similar to ones shown in FIGS. 1 and 2) with three grid ion beam optics, a rotating fixture with a shutter to hold substrates, a mechanical shutter disposed between the ion source and the substrate such as to block line of sight to the substrate from the ion source, and a loadlock chamber for substrate transfer between atmosphere and the vacuum chamber. Background pressure in the chamber was kept under about 1–2 $10^{-7}$ Torr.

Process control parameters includes: gas flow, RF power input, and voltages applied to the first and the second grids. The third-decelerator grid was maintained below ground potential.

Process performance parameters for ion beam processing included: deposition (etch) rate, deposition (etch) uniformity over 8" area, rate and uniformity reproducibility, arcing in the source leading to spikes of voltage on a deposited surface controlled by a sensor in the deposition areas. The level of macroparticulates for deposition processes was estimated by the deviation of electrical resistivity over the surface of the deposited coatings (percentage of total deposition area where resistivity exceeds 70% of the maximal resistivity). A significant drop in resistivity is an indication of pin holes in the film. Surface contamination by macroparticles is a common cause of pinholes.

A 6"×1" Si strip was used for rate and uniformity evaluation (performed by ellipsometer and stylus-type profiler), and 3" Si conductive wafer was used for measurements of resistivity deviation.

The time between repetitive runs was in range of about 0.3–20 min.

EXAMPLE 1

A 6"×1" Si strip and 3" Si conductive wafer were loaded into the fixture of the chamber, and protected from the plasma and ions by the shutter. An argon plasma was generated for about 1 min in the source under the following conditions: argon flow about 15 sccm, RF power input about 400 watts. The source chemical conditioning was performed by having methane plasma in the source under methane flow of about 60 sccm, an RF power input of about 400 watts for about 1 min; and ion beam stabilization was achieved by having methane plasma and ion beam under methane flow about 60 sccm, RF power input about 400 watts, about 350 volts on the first grid and about −400 volts on the second grid for about 15 sec. Deposition of the diamond-like carbon (DLC) film was performed under the same conditions as the ion beam stabilization for about 1 min by opening the shutter and subjecting the surface to the ion beam. Then the deposition shutter was closed and the samples removed in the loadlock. Prior to the actual removal of precipitates, the source was operated for about 40 seconds with Ar flow of about 15 sccm, RF input about 350 watts, voltage on the first grid about 95V, and on the second grid—about 240V. During the 2.5 min of the cleaning with the oxygen-argon plasma mixture, argon flow was about 12 sccm, oxygen flow about 12 sccm (ratio Ar/O2=1, RF power input about 450 watts, voltage on the first grid about 95V, and voltage on the second grid about −240V. The last step was the argon plasma and beam in the source operating with Ar flow about 15 sccm, RF power input about 400 watts, voltage on the first grid about 95V, and on the second grid about 240V for 40 seconds.

Process performance parameters: thickness about 110A, thickness uniformity over 8" area about 2.5%, thickness reproducibility standard deviation less than 2.5 A over 1000 runs, uniformity reproducibility H−L/H+L (highest=H, lowest=L values of thickness)less than about 3% over 1000 runs, no arcing in the source leading to spikes of the voltage on a deposited surface was observed; percentage of total deposition area where resistivity exceeds about 70% of the maximal resistivity greater than about 90%.

EXAMPLE 2

This example is similar to the previous one except for the cleaning procedure. Accordingly, to avoid repetition only the cleaning procedure will be described in detail. Prior to the actual precipitates removal, the source was operated for 40 seconds with Ar flow of about 15 sccm, RF input about 350 watts, voltage on the first grid about 95V, and on the second grid about 240V. During the 2.5 min of the cleaning with the oxygen-argon plasma mixture, argon flow was about 12 sccm, oxygen flow about 12 sccm (ratio Ar/O2 about 1, RF power input about 450 watts). Voltages on the first and second grids, were set to zero. The last step was the argon plasma and beam in the source operating with Ar flow about 15 sccm, RF power input about 400 watts, voltage on the first grid about 280V, and on the second grid about 240V for about 2 min.

Process performance parameters: thickness about 109 A, thickness uniformity over 8" area about 2.5%, thickness reproducibility standard deviation less than about 2.6 A over 1000 runs, uniformity reproducibility H−L/H+L (highest=H, lowest=L values of thickness) less than about 2.9% over 1000 runs. No arcing in the source leading to spikes of the voltage on a deposited surface was observed. The percentage of total deposition area where resistivity exceeded 70% of the maximal resistivity was greater than about 90%.

EXAMPLE 3

This example is similar to the previous one except for the cleaning procedure. Accordingly, to avoid repetition only the cleaning procedure will be described in detail. During the first step of the cleaning procedure the source was operated for about 4 min with Ar flow of about 15 sccm, RF input about 400 watts, voltages on the first and second grids were set to zero, amplitude of ac voltage on the auxiliary electrode was set to about 100V. The second step was the argon plasma and beam in the source operating with Ar flow about 15 sccm, RF power input about 400 watts, voltage on the first grid about 280V, and on the second grid about 240V for about 2 min.

Process performance parameters: thickness about 112 A, thickness uniformity over 8" area about 2.7%, thickness reproducibility standard deviation less than about 2.4 A over about 500 runs, uniformity reproducibility H−L/H+L (highest=H, lowest=L values of thickness) less than about 2.9% over about 500 runs. No arcing in the source leading to spikes of the voltage on a deposited surface was observed. The percentage of total deposition area where resistivity exceeds about 70% of the maximal resistivity was greater than about 90%.

EXAMPLE 4

A thick film magnetic head with a pole structure comprising a top pole (magnetic material such as NiFe) over an aluminum oxide gap layer which isolates the bottom pole or shared shield. FIG. 3 illustrates a vertical cross section through the pole portion of the thin film magnetic head. A lower permalloy (NiFe) pole or shared shield underlies an alumina gap layer which underlies a seed layer. A patterned top pole layer defined at the desired track width overlies the lower pole structure on each individual head. For this example, the patterned upper pole is formed by selective electroplating through a mask onto the seed layer.

This structure is repeated many times on a wafer made up of Alumina and TiC. This wafer is transferred into the ion beam system, clamped, and cooled using, e.g. backside gas. It is initially protected from the plasma and ions by a physical shutter: An argon plasma is first generated and a beam is extracted for about 2 minutes at stage tilt angle of −10 degrees (where 0°=ion beam normal to substrate and substrate is vertical, negative angle obtained when the substrate is tilted toward the ground) to remove the seed layer under the following conditions: argon flow about 18 sccm, RF power input about 800 watts, 700 volts on the first grid and −400 volts on the second grid. To remove the alumina gap layer (e.g. 300 nm alumina) a mix of argon and CHF3 is introduced into the ion source to increase the etch rate of the alumina while decreasing the etch rate of the permalloy. The argon to CHF3 gas mix is set to 1:3 and the operating conditions are as follows: argon flow about 7 sccm, CHF3 flow about 21 sccm, RF power input about 1000 watts, 700 volts on the first grid and −400 on the second grid. After providing the plasma in the source and generating the ion beam from the plasma the actual substrate processing lasted for about 3 minutes at 0° and about 1 minute at −70°. Once this process is finished a cleaning procedure is initiated to remove precipitates formed on the first grid. After the shutter closes and the wafer is brought to the loading position, the gas mix is changed to argon and oxygen to remove precipitates in the source with no ion beam extraction, the parameters for which are: grids at 0 voltage, argon flow of about 13 sccm, oxygen flow of about 13 sccm, and RF power input about 1000 watts for about 8 minutes. The final step is to perform a series of argon etches that remove about 0.5 microns of bottom pole material which is performed using 18 sccm of argon at multiple substrate tilt angles (0° for about 50–66% of the total etch time and at −70° for about 33–50% of the total etch time) with 700 volts on the first grid and −400 volts on the second. This step can last from 15 to 20 minutes.

Process performance results: Etch selectivity 20:1 (alumina:permalloy), Alumina reactive ion beam etch rate 100 nm/min, nonuniformity over 8.5" diagonal less than 3.0%. nonuniformity and rate producibility less than 3.5% over 200 runs.

EXAMPLE 5

This example is similar to the previous except for the cleaning procedure, so to avoid repetition only the cleaning procedure will be described in detail. After completion of the alumina gap removal, the wafer is brought to 70 degrees fixture tilt angle, the gas mix is changed to argon and oxygen to remove precipitates in the source on the first and second grids. The parameters are: argon flow about 13 sccm, oxygen flow about 13 sccm, and RF power input about 800 watts, 700 volts on the first grid and −400 volts on the second grid for about 2 minutes. This is followed by shutter closure and putting the voltages on both the first and second grids to zero, and cleaning the remaining polymer precipitate off the first grid and the quartz bowl. The remaining process parameters are: argon flow about 13 sccm, oxygen flow about 13 sccm, and RF power input about 1000 watts for about 8 minutes.

Process performance results: Selectivity 20:1 (alumina:permalloy), Alumina reactive ion beam etch rate −100 nm/min, nonuniformity over 8.5" diagonal less than 3.0%, nonuniformity and rate reproducibility less than 3.5% over 250 runs.

Without departing from the spirit and scope of this invention, one of ordinary skill in the art can make various changes and modifications to the inventions to adapt it to various usage's and conditions. As such, these changes and modifications are properly, equitably, and intended to be, within the full range of equivalencies of the following claims.

What we claim is:

1. A method for repetitive ion beam processing of a surface on a substrate with a carbon containing ion beam using a gridded RF or microwave ion source, the RF or microwave ion source including a vessel having a plurality of walls defining an interior for containing a plasma, the vessel including an inlet communicating with the interior of the vessel and connectable to a source of a precursor gas, an RF or microwave energy generator for communication with the gas in the interior of the vessel and for effecting ionization of the gas in the vessel and creating the plasma, and an ion optics assembly through which an ion beam is dischargable, the optics assembly having a first conductive grid member, the method comprising the steps of:

providing a carbon containing plasma in the RF or microwave ion source;

generating a carbon containing ion beam from said carbon containing plasma;

processing said surface of the substrate with said ion beam under predetermined conditions including a discharge power level, a flow of precursor gas and an application of a potential to the plasma; and generating in the RF or microwave ion source a plasma formed from a mixture of an inert gas and oxygen having a ratio of mass flow rates of inert gas to oxygen in the range from about 1-to-4 to about 2-to-1 to reactively etch precipitates formed on the grid and source walls with ions and radicals formed in said inert gas and oxygen plasma mixture.

2. A method according to claim 1 which further comprises the steps of:

prior to providing said carbon containing plasma in the source, providing a substantially inert gas plasma in the source for a sufficient period of time to establish steady state thermal conditions in the source;

prior to said processing step, stabilizing said carbon containing ion beam under substantially the same conditions as said processing step; and wherein the carbon containing plasma is provided in the source prior to generating said carbon containing ion beam for a time sufficient to establish steady state plasma conditions in the source for conditioning the source, said conditioning being performed under substantially the same discharge power level and precursor gas flow as is employed during said processing of the substrate.

3. A method according to claim 1 wherein said carbon containing ion beam is formed from a precursor gas selected from the group consisting of hydrocarbon and halocarbon species and mixtures thereof.

4. A method according to claim 3 wherein the hydrocarbon and halocarbon species are selected from the group consisting of CH4, C2H4, C2H2, CHF3, CF4, and C2F6.

5. A method according to claim 1 wherein said carbon containing ion beam is formed from a precursor gas selected from the group consisting of hydrocarbon species with an inert gas, halocarbon species with an inert gas, and mixtures of hydrocarbon and halocarbon species with an inert gas.

6. A method according to claim 1 wherein said carbon containing ion beam is formed from a precursor gas selected from the group consisting of hydrocarbon species, halocarbon species, hydrocarbon species with nitrogen, halocarbon species with nitrogen, and mixtures of hydrocarbon and halocarbon species with nitrogen.

7. A method according to claim 1 wherein said inert gas is argon.

8. A method according to claim 1 wherein the optics assembly includes a second conductive grid member, the method further comprising the steps of:

after said generating a plasma to reactively etch precipitates, providing a substantially inert gas plasma in the source;

generating an ion beam from said inert gas plasma; and directing a portion of said inert gas ion beam to the second grid member by applying a positive voltage to the first grid member, and a negative voltage to the second grid member to clean precipitates on the second grid surface by inert ion bombardment.

9. A method according to claim 8 wherein said positive voltage on the first grid member is less than about 300 V.

10. A method according to claim 8 wherein the negative voltage on said second grid member is set to a minimum value that prevents elections from backstreaming into the source.

11. A method according to claim 8 wherein the negative voltage on the-second grid member is in the range of about −200 V to about −250 V.

12. A method according to claim 1 wherein the optics assembly further includes a second conductive grid member and wherein the method further comprises the steps of:

before said generating a plasma to reactively etch precipitates, providing a substantially inert gas plasma in the source;

generating an ion beam from said inert gas plasma; and directing a portion of said inert gas ion beam to the second grid member by applying a positive voltage to the first grid member, and a negative voltage to the second grid member to clean precipitates on the second grid surface by inert ion bombardment.

13. A method according to claim 12 wherein said positive voltage on the first grid member is less than about 300 V.

14. A method according to claim 12 wherein the negative voltage on the second grid is set to a minimum value that prevents electrons from backstreaming into the source.

15. A method according to claim 12 wherein the negative voltage on the second grid member is in the range of about −200 V to about −250 V.

16. A method according to claim 1 wherein the optics assembly further includes a second grid member and wherein the method further comprises the step of generating a mixed plasma ion beam from said inert gas-oxygen mixture plasma and directing a portion of said mixed plasma ion beam to the second grid member by applying positive voltage on the first grid member and negative voltage on the second grid member.

17. A method according to claim 16 wherein the positive voltage on the first grid is less than about 100 V.

18. A method according to claim 16 wherein the negative voltage on the second grid is set to a minimum value that prevents electrons from backstreaming into the source.

19. A method according to claim 16 wherein the negative voltage on the second grid member is in the range of about −200 V to about −250 V.

20. A method according to claim 1 wherein the optics assembly further includes a second conductive grid member and wherein the method further comprises the steps of:

prior to the inert gas-oxygen plasma reactive etching step, providing a first substantially inert gas plasma in the source; generating a first inert gas ion beam from said substantially inert gas plasma and directing a portion of said inert gas ion beam to the second grid member by applying a positive voltage to the first grid member, and a negative voltage to the second grid member to reduce the amount of precipitates on the second grid member by inert ion bombardment; and after said inert gas-oxygen plasma reactive etching step, providing a second substantially inert gas plasma in the source, generating a second inert gas ion beam from said second substantially inert gas plasma and directing a portion of said second inert gas ion beam to the second grid member by applying a positive voltage to the first grid member and a negative voltage on the second grid member to remove precipitates from the second grid, and to clean the source from absorbed water and other oxygen and fluorine based volatile compounds by inert ion bombardment.

21. A method according to claim 20 wherein during said steps of directing said first and second inert gas ion beams to said second grid member the positive voltage on the first grid member is less than about 300 V.

22. A method according to claim 21 wherein the negative voltage on the second grid is set to a minimum value that prevents electrons from backstreaming into the source.

23. A method according to claim 21 wherein the negative voltage on the second grid member is in the range of about −200 V to about −250 V.

24. A method according to claim 1 wherein the optics assembly further includes a second conductive grid member and wherein the method further comprises the steps of:

generating a mixed plasma ion beam from said inert gas-oxygen mixture plasma and directing a portion of said mixed plasma ion beam to the second grid member by applying a positive voltage to the first grid member and a negative voltage to the second grid member;

prior to said inert gas-oxygen plasma reactive etching step, providing a first substantially inert gas plasma in the source; generating a first inert gas ion beam from said substantially inert gas plasma; and directing a portion of said first inert gas ion beam to the second grid member by applying a positive voltage to the first grid member and a negative voltage to the second grid member to reduce the amount of hydrogen and halogen contained in the precipitates by the precipitates surfaces inert ion bombardment, and after said inert gas-oxygen plasma mixture reactive etching step, providing a second substantially inert gas plasma in the source, generating a second inert gas ion beam and directing a portion of said second inert gas ion beam to the second grid member by applying positive voltage to the first grid member and a negative voltage to the second grid member to clean the source from absorbed water, and other oxygen and fluorine based volatile compounds by the etched surfaces inert ion bombardment.

25. A method according to claim 24 wherein during the respective steps of directing said mixed ion beam and said first and second inert gas ion beams to the second grid member, the positive voltage on the first grid member is less than about 100 V, and the magnitude of said negative voltage on the second grid member is set to a minimum value that prevents electrons from back streaming into the source.

26. A method according to claim 24 wherein said negative voltage on the second grid member is in the range of about −200 V to about −250 V.

27. The method according to claim 1, wherein said reactive etch does not overclean the precipitates.

28. The method according to claim 1, wherein said application of the potential to the plasma is provided by applying a voltage to said first grid member.

* * * * *

UNITED STATES PATENT AND TRADEMARK OFFICE
CERTIFICATE OF CORRECTION

PATENT NO. : 6,464,891 B1
DATED : October 15, 2002
INVENTOR(S) : Druz et al.

It is certified that error appears in the above-identified patent and that said Letters Patent is hereby corrected as shown below:

Title page,
Item [56], References Cited, OTHER PUBLICATIONS,
"#85014814, IBM Technical Disclosure Bulletin "Novel Technique to Improve Water Via Resistances" Vol. 27, No. 8, p. 4814, Jan. 1, 1985*"" should read -- #85014814, IBM Technical Disclosure Bulletin "Novel Technique to Improve Wafer Via Resistances" Vol. 27, No. 8, p. 4814, Jan. 1, 1985.* --

Column 7,
Line 41, "the, normal" should read -- the normal --

Column 10,
Line 27, "shutter: An" should read -- shutter. An --

Column 12,
Line 46, "the-second" should read -- the second --

Signed and Sealed this

Twenty-second Day of April, 2003

JAMES E. ROGAN
*Director of the United States Patent and Trademark Office*